United States Patent
Chen et al.

(10) Patent No.: US 7,915,919 B1
(45) Date of Patent: Mar. 29, 2011

(54) DIGITAL INTERFACE SENSING APPARATUS

(75) Inventors: Yang-Yuan Chen, Taipei Hsien (TW); Ming-Chih Hsieh, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/824,834

(22) Filed: Jun. 28, 2010

(30) Foreign Application Priority Data

Jun. 9, 2010 (TW) .................... 99118648

(51) Int. Cl.
*H03K 17/16* (2006.01)
*H03K 19/0175* (2006.01)

(52) U.S. Cl. .......................... 326/62; 326/30

(58) Field of Classification Search ............ 326/30
See application file for complete search history.

(56) References Cited

U.S. PATENT DOCUMENTS

| | | | | |
|---|---|---|---|---|
| 5,892,933 A * | 4/1999 | Voltz | | 710/316 |
| 7,113,587 B1 * | 9/2006 | Fischer et al. | | 379/377 |
| 7,626,439 B2 * | 12/2009 | Miao et al. | | 327/309 |
| 7,814,249 B2 * | 10/2010 | Seo | | 710/110 |
| 2004/0095952 A1 * | 5/2004 | Zhang et al. | | 370/438 |
| 2007/0216548 A1 * | 9/2007 | Alfano et al. | | 341/50 |
| 2007/0219756 A1 * | 9/2007 | Frankel et al. | | 702/188 |
| 2007/0285042 A1 * | 12/2007 | Frankel et al. | | 318/599 |
| 2008/0183919 A1 * | 7/2008 | Bourne et al. | | 710/52 |
| 2010/0022234 A1 * | 1/2010 | Stepanian | | 455/420 |
| 2010/0194363 A1 * | 8/2010 | Cho et al. | | 323/282 |

\* cited by examiner

*Primary Examiner* — Rexford N Barnie
*Assistant Examiner* — Thienvu V Tran
(74) *Attorney, Agent, or Firm* — Frank R. Niranjan

(57) ABSTRACT

A digital interface sensing apparatus includes a sensor, an analog detecting circuit, an analog to digital (A/D) converter, a signal cable, and an interface adjusting circuit. The sensor senses an external analog signal. The analog detecting circuit detects the sensed analog signal from the sensor. The A/D converter converts the sensed analog signal to a digital signal and receives a clock signal and a data demand signal. The A/D converter sends the digital signal in response to the A/D converter receiving the clock signal and the data demand signal. The interface adjusting circuit adjusts digital signals between the A/D converter and the signal cable to match signal transmission.

2 Claims, 1 Drawing Sheet

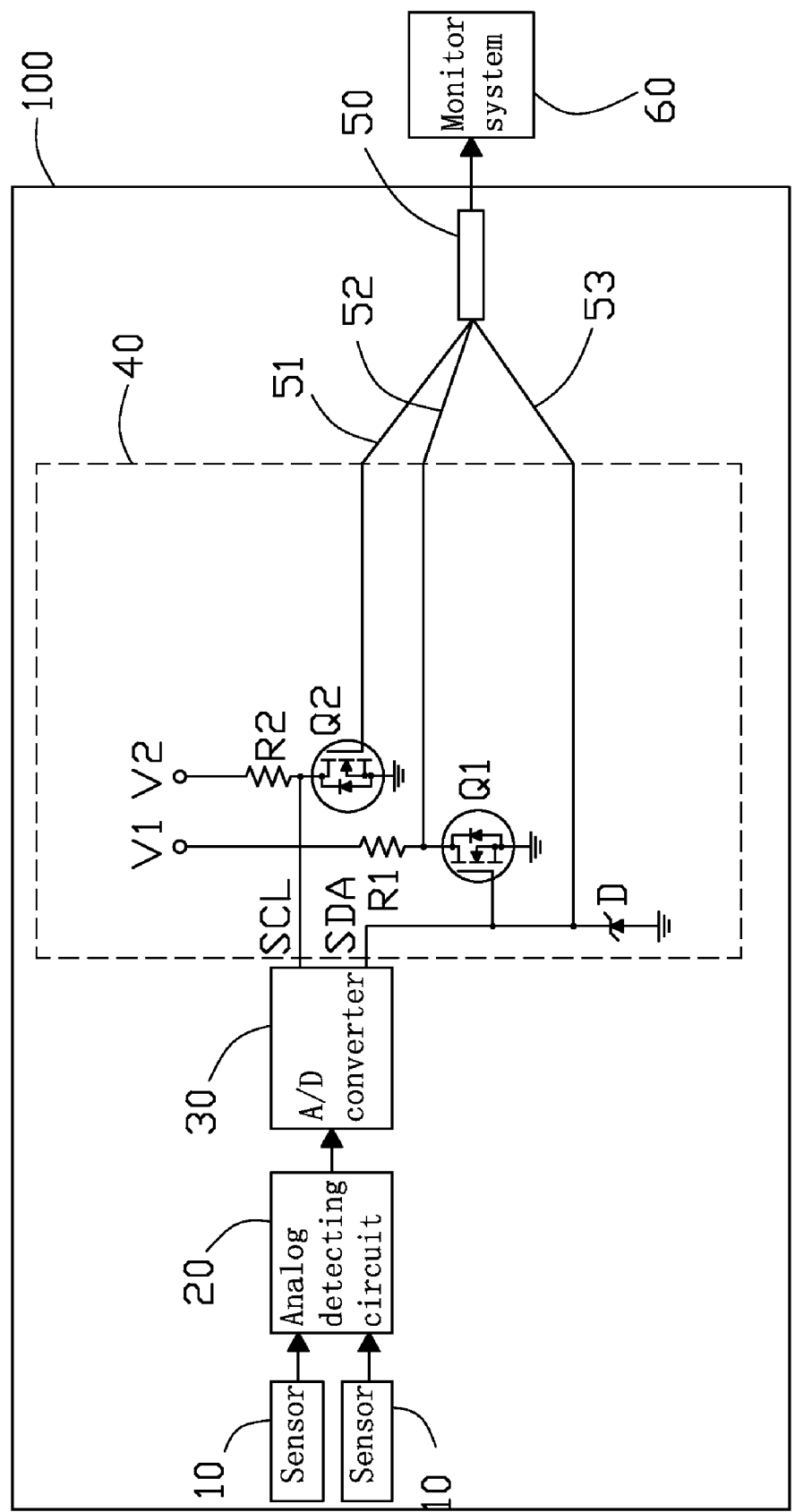

DIGITAL INTERFACE SENSING APPARATUS

BACKGROUND

1. Technical Field

The present disclosure relates to a digital interface sensing apparatus.

2. Description of Related Art

Many sensing apparatuses are used to sense analog signals, such as temperature and humidity. A monitor system will receive the sensed signals from a sensing apparatus via a signal cable to process these signals. However, because the sensed signals are analog signals, the signal cable may influence signal transmitting quality. Therefore there is room for improvement in the art.

BRIEF DESCRIPTION OF THE DRAWING

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

The FIGURE is a circuit diagram of a digital interface sensing apparatus, together with a monitor system.

DETAILED DESCRIPTION

The disclosure, including the accompanying drawing in which like references indicate similar elements, is illustrated by way of example and not by way of limitation. It should be noted that references to "an" or "one" embodiment in this disclosure are not necessarily to the same embodiment, and such references mean at least one.

Referring to the drawing, an embodiment of a digital interface sensing apparatus 100 includes two sensors 10, an analog detecting circuit 20, an analog to digital (A/D) converter 30, an interface adjusting circuit 40, and a signal cable 50. The sensors 10 are used to sense external analog signals, such as temperature signals and humidity signals. The analog detecting circuit 20 is used to detect the sensed analog signals from the sensors 10 and send them to the A/D converter 30. The A/D converter 30 is used to convert the sensed analog signals to digital signals and send the digital signals to the interface adjusting circuit 40. The signal cable 50 includes first to third lines 51-53. The analog detecting circuit 20 and the A/D converter 30 fall within well-known technologies, and are therefore not described here. In other embodiments, the number of the sensors 10 can be changed according to requirements.

The interface adjusting circuit 40 is used to adjust digital signals between the A/D converter 30 and the signal cable 50 to match signal transmission. The interface adjusting circuit 40 includes a first voltage source V1, such as 12 volts (V), a second voltage source V2, such as 3.3V, a Zener diode D, two electronic switches which are two field effect transistors (FETs) Q1 and Q2, and two resistors R1 and R2.

The first voltage source V1 is connected to the drain of the FET Q1 via the resistor R1. The source of the FET Q1 is grounded. The gate of the FET Q1 is connected to a data pin SDA of the A/D converter 30. The data pin SDA of the A/D converter 30 is also connected to the cathode of the Zener diode D. The anode of the Zener diode D is grounded. A clock pin SCL of the A/D converter 30 is connected to the drain of the FET Q2. The second voltage source V2 is connected to the drain of the FET Q2 via the resistor R2. The source of the FET Q2 is grounded. The gate of the FET Q2 is connected to the first line 51 of the signal cable 50. The drain of the FET Q1 is connected to the second line 52 of the signal cable 50. The gate of the FET Q1 is connected to the third line 53 of the signal cable 50.

In use, the signal cable 50 is connected to a recommended standard 232 (RS-232) interface of the monitor system 60. The first line 51 of the signal cable 50 is a clock signal data line, the second and third lines 52 and 53 are respectively receiving data signal line and transmitting data signal line. The first voltage source V1 satisfies the voltage standard of RS-232 interface. The second voltage source V2 and the stable voltage of the Zener diode D both satisfy the voltage standard of inter-integrated circuit (I2C) interface.

In detecting, the monitor system 60 sends a first clock signal via the first line 51. Because the FET Q2 is controlled to be turned on and off by the first clock signal which having a 12V voltage, the clock pin SCL of the A/D converter 30 receives a corresponding second clock signal at the drain of the FET Q2. When the FET Q2 is turned off, the clock pin SCL of the A/D converter 30 is at voltage V2. When the FET Q2 is turned on, the clock pin SCL of the A/D converter 30 goes to ground. So the clock pin SCL of the A/D converter 30 has no effect on the monitor system 60. The second clock signal has a same frequency with the first clock signal and has a 3.3V voltage which can match the voltage standard of the A/D converter 30. The monitor system 60 sends a data demand signal via the third line 53 of the signal cable 50. The data pin SDA of the A/D converter 30 receives the data demand signal from the monitor system 60. The A/D converter 30 sends first digital signals, corresponding to the analog signals sensed by the sensors 10, to the gate of the FET Q1. Because the FET Q1 is controlled to be turned on and off by the first digital signals which having a 3.3V voltage, the second line 52 of the signal cable 50 receives a corresponding second digital signals at the drain of the FET Q1. When the FET Q1 is turned off, the second line 52 is at voltage V1. When the FET Q1 is turned on, the second line 52 is grounded. Any signals on the data pin SDA of the A/D converter 30 will effect the FET Q1 and/or be propagated along the third line 53. The monitor system 60 receives the digital signals from the A/D converter 30. The second digital signals have a same frequency with the first digital signals and have a 12V voltage which can match the voltage standard of the monitor system 60. Therefore, the A/D converter 30 can communicate with the monitor system 60 in digital mode, which can increase signal transmitting quality.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A digital interface sensing apparatus comprising:
   a sensor to sense an external analog signal;
   an analog detecting circuit to detect the sensed analog signal from the sensor;
   an analog to digital (A/D) converter to convert the sensed analog signal to a digital signal, and receive a clock signal and a data demand signal, wherein the A/D converter sends the digital signal in response to the A/D converter receiving the clock signal and the data demand signal;

a signal cable comprising first to third lines; and an interface adjusting circuit comprising first and second voltage sources, a Zener diode, and first and second electronic switches, the first voltage source is connected to a first terminal of the first electronic switch, a second terminal of the first electronic switch is grounded, a control terminal of the first electronic switch is connected to a data pin of the A/D converter, the data pin of the A/D converter is also connected to the cathode of the Zener diode, the anode of the Zener diode is grounded, a clock pin of the A/D converter is connected to a first terminal of the second electronic switch, the second voltage source is connected to the first terminal of the second electronic switch, a second terminal of the second electronic switch is grounded, a control terminal of the second electronic switch is connected to the first line of the signal cable, the first terminal of the first electronic switch is connected to the second line of the signal cable, the control terminal of the first electronic switch is connected to the third line of the signal cable, the first voltage source satisfies the voltage standard of recommended standard 232 interface, the second voltage source and a stable voltage of the Zener diode both satisfy the voltage standard of inter-integrated circuit interface.

2. The digital interface sensing apparatus of claim 1, wherein the first and second electronic switches are field effect transistors (FETs), the first terminals are drains, the second terminals are sources, and the control terminals are gates.

* * * * *